United States Patent
Chang et al.

(10) Patent No.: US 11,139,404 B2
(45) Date of Patent: Oct. 5, 2021

(54) PHOTOSENSOR

(71) Applicant: Au Optronics Corporation, Hsinchu (TW)

(72) Inventors: Po-Chao Chang, Taoyuan (TW); Ruei-Pei Chen, Hsinchu County (TW); Chao-Chien Chiu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 14 days.

(21) Appl. No.: 16/538,833

(22) Filed: Aug. 13, 2019

(65) Prior Publication Data

US 2020/0274004 A1  Aug. 27, 2020

(30) Foreign Application Priority Data

Feb. 21, 2019 (TW) ................................ 108105806

(51) Int. Cl.

| H01L 27/146 | (2006.01) |
|---|---|
| H01L 31/0216 | (2014.01) |
| H01L 31/02 | (2006.01) |
| H01L 31/0224 | (2006.01) |
| G06K 9/00 | (2006.01) |

(52) U.S. Cl.
CPC .... *H01L 31/0216* (2013.01); *H01L 27/14612* (2013.01); *H01L 27/14623* (2013.01);
(Continued)

(58) Field of Classification Search
CPC .......... H01L 31/0216; H01L 27/14612; H01L 27/14623; H01L 27/14678; H01L 31/02016; H01L 31/0224; H01L 27/14643; H01L 27/14609; H01L 21/823481; H01L 27/088; H01L 21/76224; H01L 21/823418; H01L 29/0847; H01L 21/823431; H01L 21/823814; H01L 21/823456;
(Continued)

(56) References Cited

U.S. PATENT DOCUMENTS 9,990,530 B2   6/2018  Hsieh et al.
2006/0237751 A1*  10/2006  Morimoto .............. H04N 5/238
                                                                  257/232
(Continued)

FOREIGN PATENT DOCUMENTS

| CN | 105913021 | 8/2016 |
| CN | 106684202 | 5/2017 |

(Continued)

*Primary Examiner* — Samuel Park
(74) *Attorney, Agent, or Firm* — JCIPRNET

(57) ABSTRACT

A photosensor includes a substrate, a sensing device, and a light shielding layer. The sensing device is disposed on the substrate and includes a first electrode, a photo-sensing layer, and a second electrode. The first electrode is disposed on the substrate. The photo-sensing layer is disposed on the first electrode. The second electrode is disposed on the photo-sensing layer, and the photo-sensing layer is interposed between the first electrode and the second electrode. The light shielding layer is disposed on the second electrode. Here, the photo-sensing layer has a shielded portion shielded by the light shielding layer and a photo-receiving portion not shielded by the light shielding layer, and an area of the shielded portion is 55% to 99% of an entire area of the photo-sensing layer.

17 Claims, 6 Drawing Sheets

(52) U.S. Cl.
CPC .. *H01L 27/14678* (2013.01); *H01L 31/02016* (2013.01); *H01L 31/0224* (2013.01); *G06K 9/00087* (2013.01)

(58) Field of Classification Search
CPC ............... H01L 27/0886; H01L 27/146; H01L 2224/131; H01L 27/32; G06K 9/00087; G06K 9/0004
See application file for complete search history.

(56) References Cited

U.S. PATENT DOCUMENTS

| | | | | |
|---|---|---|---|---|
| 2012/0261656 | A1* | 10/2012 | Shu | ................ H01L 31/022483 257/43 |
| 2015/0295006 | A1* | 10/2015 | Chen | ................... H01L 29/7869 257/43 |
| 2016/0163747 | A1* | 6/2016 | Koide | ............... H01L 27/14643 257/80 |
| 2017/0032167 | A1* | 2/2017 | Chen | ....................... H01L 31/09 |
| 2017/0124373 | A1* | 5/2017 | Liao | ................. H01L 27/14612 |
| 2017/0206395 | A1* | 7/2017 | Chang | ................. G06K 9/0004 |
| 2017/0213066 | A1 | 7/2017 | Hsieh et al. | |
| 2020/0265207 | A1* | 8/2020 | Chu | ..................... G06K 9/0004 |

FOREIGN PATENT DOCUMENTS

| | | | | |
|---|---|---|---|---|
| CN | 107135290 | | 9/2017 | |
| CN | 107527032 | | 12/2017 | |
| CN | 111582010 A | * | 8/2020 | ......... G02F 1/13318 |

* cited by examiner

PHOTOSENSOR

CROSS-REFERENCE TO RELATED APPLICATION

This application claims the priority benefit of Taiwan application serial no. 108105806, filed on Feb. 21, 2019. The entirety of the above-mentioned patent application is hereby incorporated by reference herein and made a part of this specification.

BACKGROUND

Technical Field

The disclosure relates to a sensor; more particularly, the disclosure relates to a photosensor.

Description of Related Art

With the development of the electronics industry and optoelectronic technology, the application and types of photosensors are increasing. For instance, the fingerprint identification function in an electronic device can be realized with use of the photosensor. Most of the photosensors sense light by using materials with photoelectric conversion characteristics, and such materials are easily deteriorated or become not sensitive when strong ambient light is given. For instance, high-intensity light may saturate the photoelectric conversion efficiency of such materials, and thus the contrast of light cannot be correctly reflected. The high-intensity light may also cause irreversible damages to the characteristics of such materials. Accordingly, the sensitivity and the service life of the photosensor still need to be improved.

SUMMARY

The disclosure provides a photosensor which can be applied to various conditions while maintaining ideal sensing sensitivity and long service life.

In an embodiment of the disclosure, a photosensor includes a substrate, a sensing device, and a light shielding layer. The sensing device is disposed on the substrate and includes a first electrode, a photo-sensing layer, and a second electrode. The first electrode is disposed on the substrate. The photo-sensing layer is disposed on the first electrode. The second electrode is disposed on the photo-sensing layer, and the photo-sensing layer is interposed between the first electrode and the second electrode. The light shielding layer is disposed on the second electrode. Here, the photo-sensing layer has a shielded portion shielded by the light shielding layer and a photo-receiving portion not shielded by the light shielding layer, and an area of the shielded portion is 55% to 99% of an entire area of the photo-sensing layer.

In view of the above, the photosensor provided in one or more embodiments of the disclosure includes the light shielding layer to shield a partial area of the photo-sensing layer of the sensing device. As such, while the photosensor is being used in an environment with strong ambient light, it is rather unlikely for the photo-sensing layer to be deteriorated or have a reduced sensitivity.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
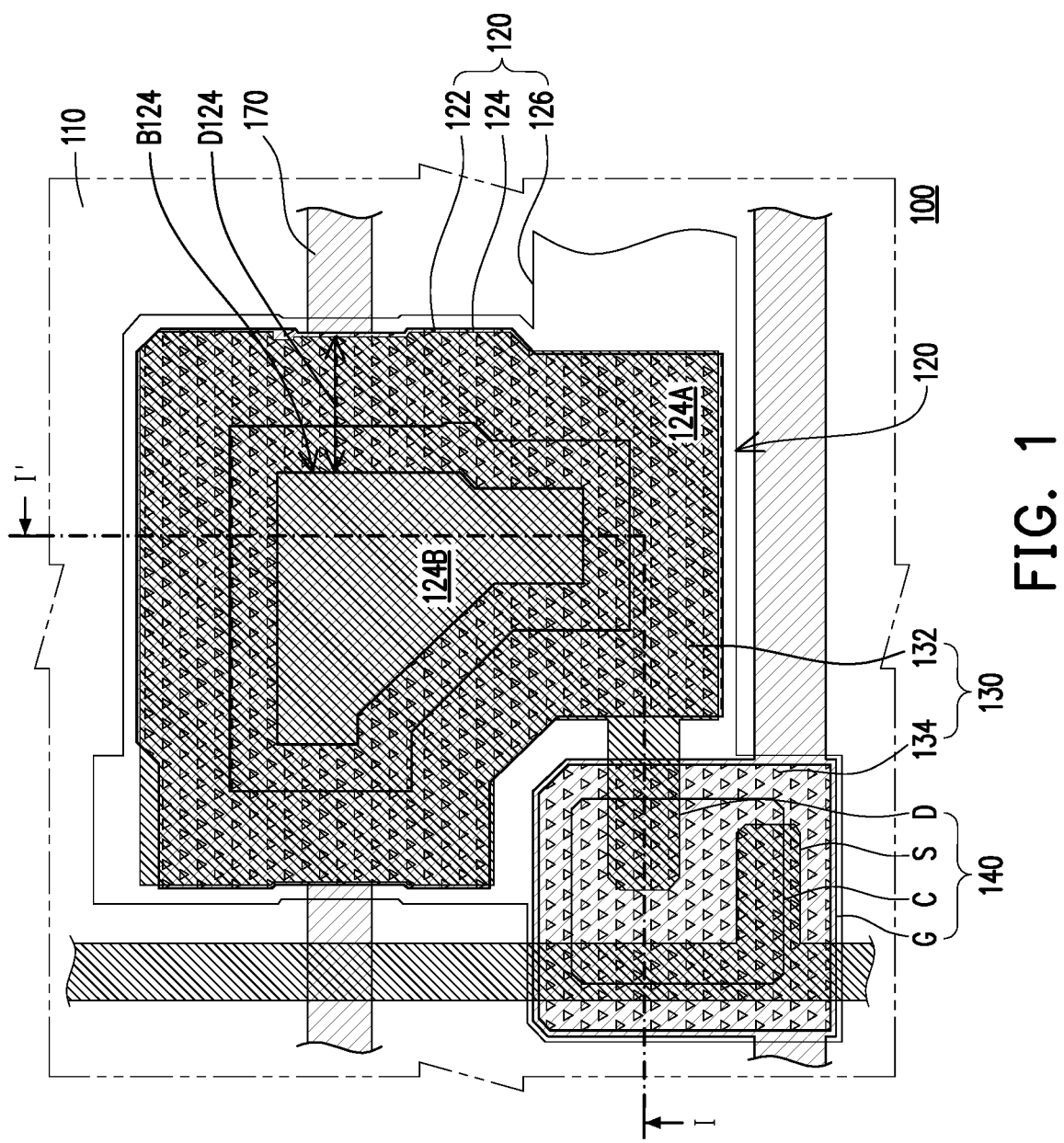
FIG. 1 is a schematic top view of a photosensor according to an embodiment of the disclosure.
Figure 2:
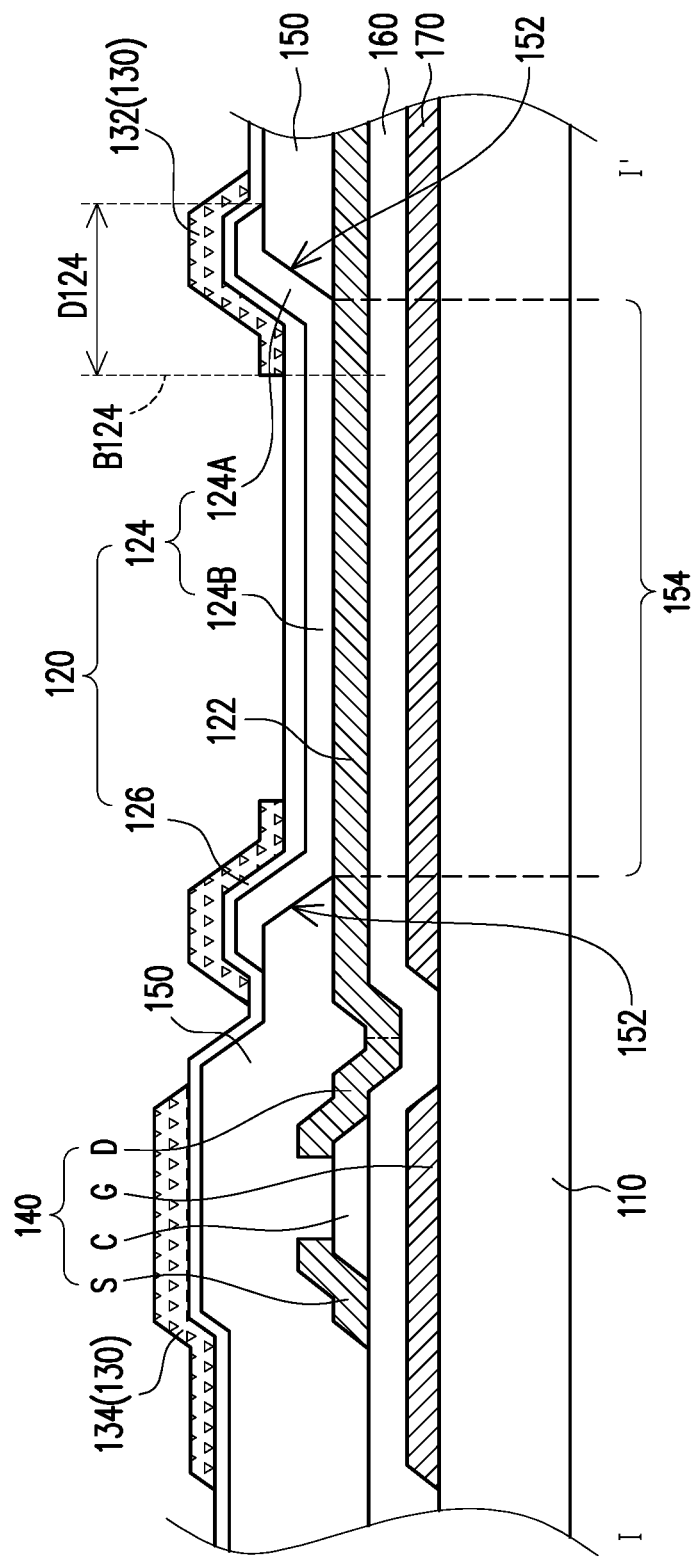
FIG. 2 is a schematic cross-sectional view of the photosensor depicted in FIG. 1 along a sectional line I-I'.

FIG. 1 is a schematic top view of a photosensor according to an embodiment of the disclosure, and FIG. 2 is a schematic cross-sectional view of the photosensor depicted in FIG. 1 along a sectional line I-I'. As shown in FIG. 1, a photosensor 100 includes a substrate 110, a sensing device 120, a light shielding layer 130, and an active device 140. In the present embodiment, the sensing device 120, the light shielding layer 130, and the active device 140 are disposed on the substrate 110, the light shielding layer 130 shields the sensing device 120 and the active device 140, and signals sensed by the sensing device 120 can be read by the active device 140 and corresponding circuits. However, the disclosure is not limited thereto. In some embodiments, the active device 140 can be omitted, and the signals sensed by the sensing device 120 can be read by other circuits (not shown) disposed on the substrate 110 or external circuits. Besides, in some embodiments, the sensing device 120 can be used together with one or more active devices 140, so as to achieve the necessary transmission of the sensed signals. Areas respectively occupied by individual components shown in the top view in FIG. 1 can be understood as areas of orthogonal projections of these components on the substrate 110 or areas occupied by the components described below.

With reference to FIG. 1 and FIG. 2, in the present embodiment, the sensing device 120 can include a first electrode 122, a photo-sensing layer 124, and a second electrode 126. The first electrode 122, the photo-sensing layer 124, and the second electrode 126 can be sequentially stacked onto the substrate 110, and an area occupied by the first electrode 122 and an area occupied by the second electrode 126 can both be overlapped with an area occupied by the photo-sensing layer 124. That is, in the present embodiment, the first electrode 122 is disposed on the substrate 110, the photo-sensing layer 124 is disposed on the first electrode 122, the second electrode 126 is disposed on the photo-sensing layer 124, and the photo-sensing layer 124 is interposed between the first electrode 122 and the second electrode 126. In the present embodiment, the area of the second electrode 126 is greater than the area of the photo-sensing layer 124, and a profile of the first electrode 122 and a profile of the photo-sensing layer 124 can be partially overlapped, which should however not be construed as limitations in the disclosure.

The first electrode 122 and the second electrode 126 can be made of a transparent or opaque conductive material, e.g., a metallic material with a solid state or a metal oxide material, wherein the metal oxide material includes indium tin oxide, indium oxide, zinc oxide, and so on. Particularly, at least one of the first electrode 122 and the second electrode 126 is required to be made of the transparent conductive material, so as to allow light beams to pass through and enter the photo-sensing layer 124. The photo-sensing layer 124 can be characterized by the capability of converting optical energy into electrical energy, so as to achieve the photo-sensing function. A material of the photo-sensing layer 124 includes a silicon-rich material, such as silicon-rich oxide, silicon-rich nitride, silicon-rich oxynitride, silicon-rich carbide, silicon-rich carbon oxide, hydrogenated silicon-rich oxide, hydrogenated silicon-rich nitride, hydrogenated silicon-rich carbide, any other appropriate material, or a combination of the aforesaid materials. In the present embodiment, the second electrode 126 allows light beams to pass through; hence, external light beams can enter the photo-sensing layer 124 through the second electrode 126.

In FIG. 1 and FIG. 2, the area filled by inverted triangle patterns represents the light shielding layer 130. The light shielding layer 130 shields a portion of the photo-sensing layer 124, and therefore the photo-sensing layer 124 can be divided into a shielded portion 124A shielded by the light shielding layer 130 and a photo-receiving portion 124B not shielded by the light shielding layer 130. In other words, an area of an orthogonal projection of the light shielding layer 130 on the substrate 110 and an area of an orthogonal projection of the shielded portion 124A of the photo-sensing layer 124 on the substrate 110 are not overlapped with the area of the orthogonal projection of the light shielding layer 130 on the substrate 110 and an area of an orthogonal projection of the photo-receiving portion 124B of the photo-sensing layer 124 on the substrate 110. Besides, as shown in FIG. 2, one portion of the light shielding layer 130 shields the photo-sensing layer 124, and an occupied area of the light shielding layer 130 can exceed an area of the photo-sensing layer 124, which should however not be construed as a limitation in the disclosure. In some alternative embodiments, the outer profile of the light shielding layer 130 can be aligned to the profile of the photo-sensing layer 124. Generally, the photo-sensing layer 124 is apt to be deteriorated due to the strong ambient light, and the strong ambient light may cause the photoelectric conversion rate of the photo-sensing layer 124 to reach or exceed a saturation limit. However, since the light shielding layer 130 provided in the present embodiment is designed to shield a partial area of the photo-sensing layer 124, said issue can be mitigated or even avoided.

When the photosensor 100 is being applied in a fingerprint identifier, the photosensor 100 can include a plurality of sensing devices 120, and the deterioration of the photo-sensing layers 124 of the sensing devices 120 can lead to decay of the dynamic range of the signals sensed by the photosensor 100. Here, the measurement of the dynamic range of the signals sensed by the photosensor 100 can include following steps, which should however not be construed as limitations in the disclosure. The sensing devices in the entire fingerprint identifier are divided into different regions, and the dynamic range of each region can be analyzed according to the signal intensity of individual sensing devices in each region; for instance, the difference between the maximum signal intensity and the minimum signal intensity on selected conditions is obtained from the distribution of the signals from the same region, and such a difference is the dynamic range of the individual region. The dynamic ranges of respective regions are averaged to obtain the dynamic range of the signals sensed by the photosensor 100.

In the present embodiment, the decay of the dynamic range of the signals sensed by the photosensor 100 refers to the variations in the measured dynamic range before and after the irradiation of a visible light source at 100K lux lasts for 240 hours. For instance, before the irradiation by the visible light source at 100K lux, the measured dynamic range is DR1; after the irradiation by the visible light source at 100K lux lasting for 240 hours, the measured dynamic range is DR2; in this case, the decay of the dynamic range is, for instance, (DR1-DR2)/DR1. To comply with the realistic terms of use, the decay of the dynamic range of the signals sensed by the photosensor 100 acting as the fingerprint identifier is required to be 40% or less. Once said decay is greater than 40%, the photosensor 100 cannot comply with the terms of use and is even unable to perform default functions normally.

According to experimental measurement results obtained in one comparison example where no light shielding layer shields the photo-sensing layer, the decay of the dynamic range of the signals sensed by the photosensor exceeds 40% and arrives at about 44.2%, for instance. By contrast, in one experimental example where the light shielding layer shields the photo-sensing layer while the overall structure here is the same as that in the comparison example, the decay of the dynamic range of the signals sensed by the photosensor can be reduced. In the event that the area of the photo-sensing layer shielded by the light shielding layer is at least 55% of the entire area of the photo-sensing layer, the decay of the dynamic range of the signals sensed by the photosensor can be controlled within 40%. Therefore, in the present embodiment, the layout area of the light shielding layer 130 is designed to allow the area of the shielded portion 124A shielded by the light shielding layer 130 to be 55%-99% of the entire area of the photo-sensing layer 124. As such, even though the photosensor 100 is in use while the strong ambient light is given, the photosensor 100 can work as normal, and the service life thereof can be extended.

The larger the area of the shielded portion 124A shielded by the light shielding layer 130, the less the amount of light received by the photosensor 100, which may decrease the intensity of the signals sensed by the photosensor 100. However, the sensing sensitivity required by the photosensor 100 can be maintained by increasing the brightness of the light source. For instance, when the photosensor 100 is applied as the fingerprint identifier, a backlight source is often applied together. When a user's finger presses the photosensor 100, the light beam provided by the backlight source can irradiate the finger and can be reflected by the finger and then received and sensed by the photosensor 100. The increase in the brightness of the backlight source can increase the amount of the light beam reflected by the finger and received by the photosensor 100. Hence, even though the area of the shielded portion 124A in the photosensor 100 is increased, the sensing sensitivity required by the photosensor 100 can be maintained by adjusting the brightness of the backlight source, so that the photosensor 100 can work as normal. In some embodiments, the ratio of the area of the photo-sensing layer 124 shielded by the light shielding layer 130 can be designed according to the backlight source used together with the photosensor 100. For instance, given that the power of the backlight source is high or the light-emitting intensity is high, the ratio of the area of the photo-sensing layer 124 shielded by the light shielding layer 130 can be high, which should however not be construed as a limitation in the disclosure.

For instance, in an experimental example, when the area of the shielded portion 124A shielded by the light shielding layer 130 is 75% of the entire area of the photo-sensing layer 124, the dynamic range of the photosensor 100 can be at around 77.3 GL, while the decay of the dynamic range of the photosensor 100 is about 26.5%. Meanwhile, given that the illuminance is 30K lux, the saturation ratio of the photosensor 100 is about 0.5. As provided above, the photosensor 100 can have favorable sensing sensitivity while 75% of the entire area of the photo-sensing layer 124 is shielded, and the decay of the dynamic range can comply with the terms of user, which is conducive to the application of the real product.

To be specific, the light shielding layer 130 provided in the present embodiment can include a first light shielding portion 132 and a second light shielding portion 134, wherein the first light shielding portion 132 shields at least a partial area of the photo-sensing layer 124, and the second light shielding portion 134 shields the area of the active device 140. As provided above, the first light shielding portion 132 serves to maintain the characteristics of the photo-sensing layer 124, and the second light shielding portion 134 can protect the active device 140 from being damaged by irradiation of light beams. Hence, the arrangement of the first light shielding portion 132 and the second light shielding portion 134 can guarantee the quality of the photosensor 100 and is even conducive to an extension of the service life of the photosensor 100.

Additionally, the first light shielding portion 132 and the second light shielding portion 134 can be formed in one film layer, and no additional manufacturing process is required. In some embodiments, a material of the light shielding layer 130 includes metal, metal nitride, a photoresist material, ink, or a combination thereof. In some embodiments, a material of the light shielding layer 130 includes MoN or Mo. According to some embodiments, the light shielding layer 130 is, for instance, a Mo/Al/Mo stacked layer or a Mo/Al/MoN stacked layer. If the light shielding layer 130 is made of metal, the light shielding layer 130 is in contact with the second electrode 126, which is conducive to the reduction of transmission impedance of the second electrode 126. In some embodiments, an etchant applied for patterning the light shielding layer 130 may also etch the photo-sensing layer 124 or react with the photo-sensing layer 124. However, the light shielding layer 130 provided in the present embodiment is formed on the second electrode 126; accordingly, in the process of manufacturing the light shielding layer 130, the photo-sensing layer 124 is covered by the second electrode 126 and is rather unlikely to be damaged in the process of manufacturing the light shielding layer 130, so as to maintain the characteristics of the photo-sensing layer 124.

In the present embodiment, the active device 140 is, for instance, a thin film transistor (TFT) and can include a gate G, a semiconductor layer C, a source S, and a drain D. The gate G and the semiconductor layer C are overlapped. The source S and the drain D are separated from each other and are both in contact with the semiconductor layer C. The first electrode 122 of the sensing device 120 can be electrically connected to the drain D. When the sensing device 120 receives external light beams and thereby generates electric signals, the electric signals can be transmitted through the active device 140 for a control circuit (not shown) to read. Besides, the active device 140 can be configured to provide necessary operation or driving signals to the sensing device 120. However, the transmission of these signals can be realized by other circuits or external circuits. Therefore, in some embodiments, the sensor 100 can selectively not include the active device 140. In the present embodiment, the first electrode 122 and the drain D can be integrally formed in one film layer; hence, they are divided by dotted lines in FIG. 2, which should however not be construed as a limitation in the disclosure. In some embodiments, the first electrode 122 and the drain D may be formed in different film layers. Besides, the second light shielding portion 134 at least shields the area of the semiconductor layer C, for instance.

In FIG. 2, the photosensor 100 not only includes the substrate 110, the sensing device 120, the light shielding layer 130, and the active device 140 but also includes insulation layers 150 and 160 configured to isolate conductive components from each other. The insulation layer 150 is disposed on the first electrode 122, and the second electrode 126 is disposed on the insulation layer 150. That is, the insulation layer 150 is disposed between the first electrode 122 and the second electrode 126. In the present embodiment, the second electrode 126 can be extended to cover the active device 140, and the insulation layer 150 is located between the second electrode 126 and the active device 140. The insulation layer 160 is disposed on the gate G and located between the gate G and the semiconductor layer C to serve as a gate insulation layer. Additionally, the photosensor 100 can further include a common electrode 170. The common electrode 170 is disposed between the first electrode 122 and the substrate 110, and the insulation layer 160 is interposed between the common electrode 170 and the first electrode 122.

As shown in FIG. 2, the insulation layer 150 has a sidewall 152, and the sidewall 152 defines an opening 154. The opening 154 exposes the first electrode 122, the photo-sensing layer 124 in the opening 154 is in contact with the first electrode 122, and the photo-sensing layer 124 is interposed between the first electrode 122 and the second electrode 126. In the present embodiment, the insulation layer 150 and the photo-sensing layer 124 are both interposed between the first electrode 122 and the second electrode 126, so that the first electrode 122 and the second electrode 126 are not in direct contact with each other. The photo-sensing layer 124 partially covers a top surface of the insulation layer 150, covers the sidewall 152 of the insulation layer 150, and covers a portion of the first electrode 122 exposed by the opening 154. Hence, one portion of the photo-sensing layer 124 is in contact with the first electrode 122, and the other portion is not in contact with the first electrode 122 but in contact with the insulation layer 150.

In the present embodiment, where the photo-sensing layer 124 is in contact with the insulation layer 150 is located at the peripheries and elevated as compared to where the photo-sensing layer 124 is in contact with the first electrode 122, and therefore where the photo-sensing layer 124 is in contact with the insulation layer 150 is apt to receive light beams at an oblique incidence angle in comparison with where the photo-sensing layer 124 is in contact with the first electrode 122, especially the light beams at a large oblique incidence angle. When the photosensor 100 serves as a fingerprint identifier, the light beams at the oblique incidence angle may be external light beams but are not reflected by fingers of a user, which may lead to deviation of the sensed signals. The light shielding layer 130 at least shields where the photo-sensing layer 124 is in contact with the insulation layer 150, which can mitigate the deviation of the sensed signals. Therefore, according to the present embodiment, the shielded portion 124A of the photo-sensing layer 124 can be arranged along the sidewall 152, wherein one portion of the shielded portion 124A of the photo-sensing layer 124 covers the sidewall 152 of the insulation layer 150, another portion covers the first electrode 122, and the other portion even covers the top surface of the insulation layer 150. However, the disclosure is not limited thereto.

With reference to FIG. 1 and FIG. 2, the first light shielding portion 132 of the light shielding layer 130 can be shaped as a ring, so that the shielded portion 124A of the photo-sensing layer 124 surrounds the photo-receiving portion 124B. A distance D124 from a junction B124 between the photo-receiving portion 124B and the shielded portion 124A of the photo-sensing layer 124 to an edge E124 of the photo-sensing layer 124 can substantially be a fixed distance. Here, the distance D124 can be the minimum distance from any point on the junction B124 to the edge E124. That is, a peripheral portion of the photo-sensing layer 124 shielded by the light shielding layer 130 and extended in an inward manner from the edge has a fixed width. As such, a profile defined by the junction B124 between the shielded portion 124A and the photo-receiving portion 124B of the photo-sensing layer 124 and a profile of the photo-sensing layer 124 can have an identical geometric shape but different sizes. However, in other embodiments, the area of the shielded portion 124A shielded by the light shielding layer 130 can have an irregular shape which need not be limited to correspond to the profile of the photo-sensing layer 124.

Figure 3:
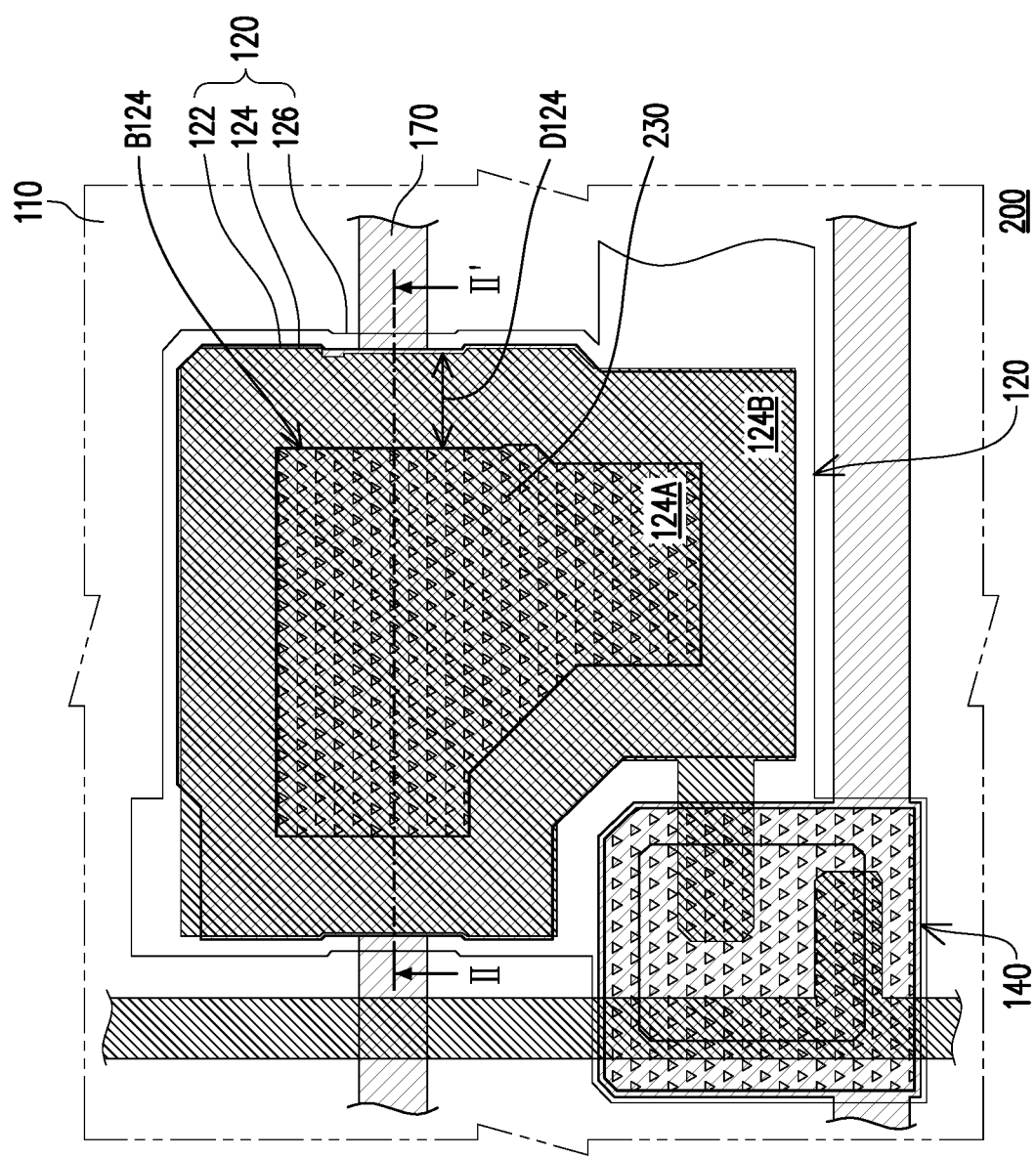
FIG. 3 is a schematic top view of a photosensor according to an embodiment of the disclosure.
Figure 4:
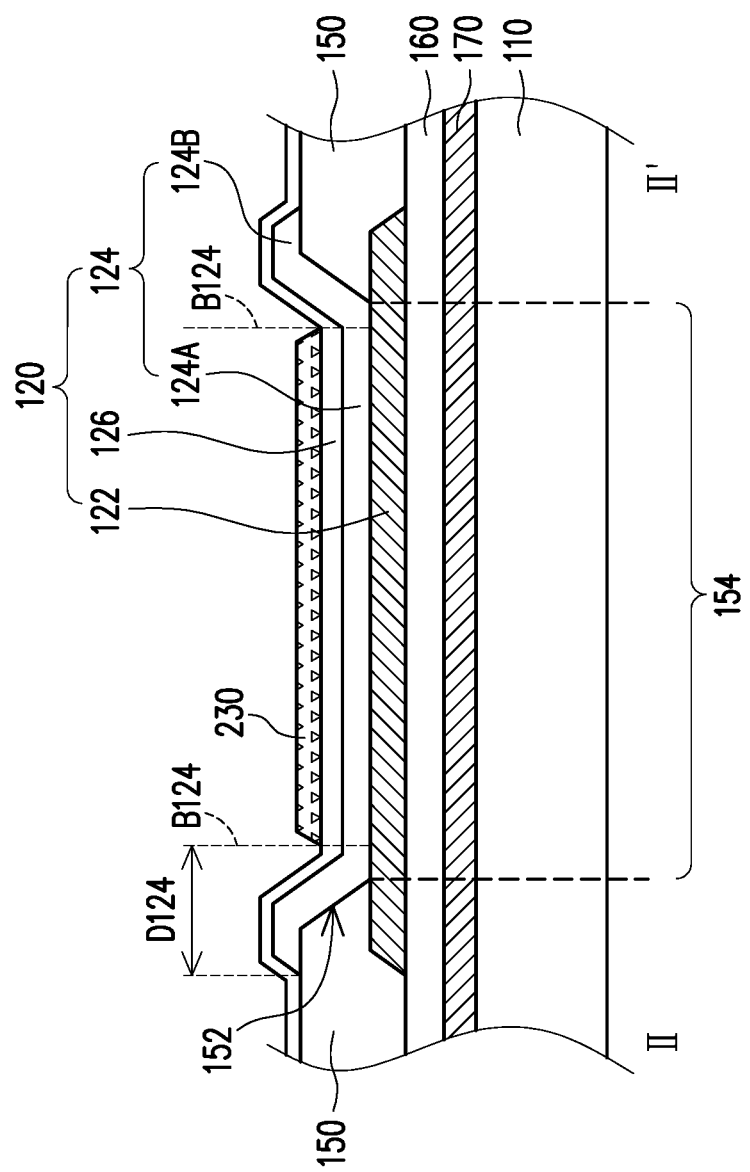
FIG. 4 is a schematic cross-sectional view of the photosensor depicted in FIG. 3 along a sectional line II-II'.

FIG. 3 is a schematic top view of a photosensor according to an embodiment of the disclosure, and FIG. 4 is a schematic cross-sectional view of the photosensor depicted in FIG. 3 along a sectional line II-II'. With reference to FIG. 3 and FIG. 4, a photosensor 200 includes the substrate 110, the sensing device 120, the light shielding layer 230, the active device 140, the insulation layer 150, the insulation layer 160, and the common electrode 170. Specifically, the sensing device 120, the light shielding layer 230, and the active device 140 are disposed on the substrate 110. The sensing device 120 includes the first electrode 122, the photo-sensing layer 124, and the second electrode 126. The first electrode 122 is disposed on the substrate 110. The photo-sensing layer 124 is disposed on the first electrode 122. The second electrode 126 is disposed on the photo-sensing layer 124. The photo-sensing layer 124 is interposed between the first electrode 122 and the second electrode 126. Besides, the light shielding layer 230 is disposed on the second electrode 126, wherein the photo-sensing layer 124 has the shielded portion 124A shielded by the light shielding layer 230 and the photo-receiving portion 124B not shielded by the light shielding layer 230, and the area occupied by the shielded portion 124A is 55%-99% of the entire area occupied by the photo-sensing layer 124. An opening 154 is defined by a sidewall 152 of the insulation layer 150, the opening 154 exposes the first electrode 122, and the photo-sensing layer 124 in the opening 154 is interposed between the first electrode 122 and the second electrode 126. The common electrode 170 is disposed between the first electrode 122 and the substrate 110, and the insulation layer 160 is interposed between the common electrode 170 and the first electrode 122.

The photosensor 200 is substantially similar to the photosensor 100 depicted in FIG. 1 and FIG. 2, and the main difference between the two embodiments lies in the layout of the light shielding layer 230. Particularly, in the present embodiment, the light shielding layer 230 is arranged to allow the photo-receiving portion 124B of the photo-sensing layer 124 to surround the shielded portion 124A. The light shielding layer 230 has a substantially solid geometric shape and shields a central portion of the photo-sensing layer 124. Besides, the profile defined by the junction B124 between the shielded portion 124A and the photo-receiving portion 124B of the photo-sensing layer 124 and the profile of the photo-sensing layer 124 can have an identical geometric shape. According to some embodiments, the distance D124 from the junction B124 between the photo-receiving portion 124B and the shielded portion 124A of the photo-sensing layer 124 to the edge E124 of the photo-sensing layer 124 can substantially be a fixed distance. In other embodiments, the area shielded by the light shielding layer 230 can be extended in an outward manner, and a portion of the photo-sensing layer 124 covering the sidewall 152 of the insulation layer 150 can be further shielded, which should however not be construed as a limitation in the disclosure.

Figure 5:
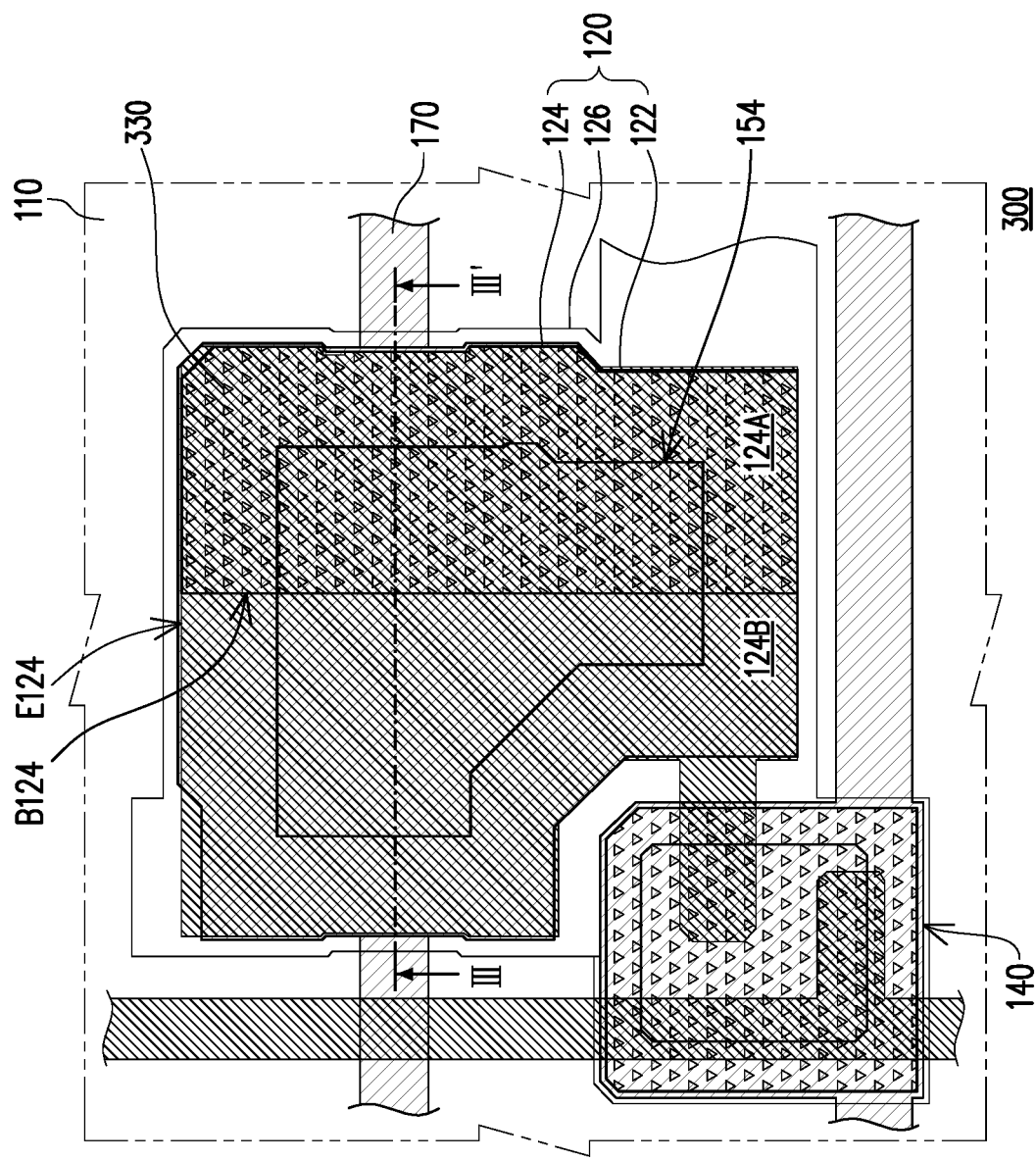
FIG. 5 is a schematic top view of a photosensor according to an embodiment of the disclosure.
Figure 6:
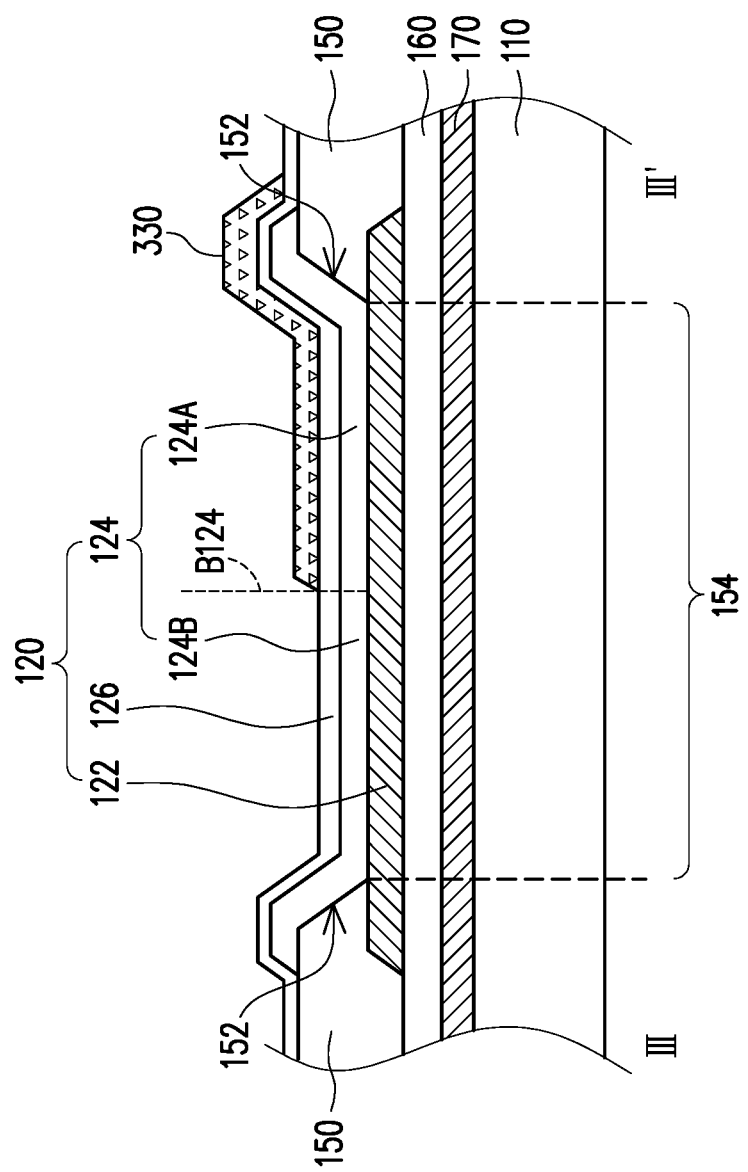
FIG. 6 is a schematic cross-sectional view of the photosensor depicted in FIG. 5 along a sectional line III-III'.

FIG. 5 is a schematic top view of a photosensor according to an embodiment of the disclosure, and FIG. 6 is a schematic cross-sectional view of the photosensor depicted in FIG. 5 along a sectional line III-III'. With reference to FIG. 5 and FIG. 6, a photosensor 300 includes the substrate 110, the sensing device 120, the light shielding layer 330, the active device 140, the insulation layer 150, the insulation layer 160, and the common electrode 170. Specifically, the sensing device 120, the light shielding layer 330, and the active device 140 are disposed on the substrate 110. The sensing device 120 includes the first electrode 122, the photo-sensing layer 124, and the second electrode 126. The first electrode 122 is disposed on the substrate 110. The photo-sensing layer 124 is disposed on the first electrode 122. The second electrode 126 is disposed on the photo-sensing layer 124. The photo-sensing layer 124 is interposed between the first electrode 122 and the second electrode 126. Besides, the light shielding layer 330 is disposed on the second electrode 126, wherein the photo-sensing layer 124 has the shielded portion 124A shielded by the light shielding layer 330 and the photo-receiving portion 124B not shielded by the light shielding layer 330, and the area occupied by the shielded portion 124A is 55%-99% of the entire area occupied by the photo-sensing layer 124. An opening 154 is defined by a sidewall 152 of the insulation layer 150, the opening 154 exposes the first electrode 122, and the photo-sensing layer 124 in the opening 154 is interposed between the first electrode 122 and the second electrode 126. The common electrode 170 is disposed between the first electrode 122 and the substrate 110, and the insulation layer 160 is interposed between the common electrode 170 and the first electrode 122.

The photosensor 300 is substantially similar to the photosensor 100 depicted in FIG. 1 and FIG. 2, and the main difference between the two embodiments lies in the layout of the light shielding layer 330. Particularly, the area shielded by the light shielding layer 330 forms a solid pattern, and the light shielding layer 330 is arranged to allow the junction B124 between the photo-receiving portion 124B and the shielded portion 124A of the photo-sensing layer 124 to extend to the edge E124 of the photo-sensing layer 124. Additionally, at least one portion of the shielded portion 124A of the photo-sensing layer 124 covers one portion of the sidewall 152 of the insulation layer 150, and at least one portion of the photo-receiving portion 124B of the photo-sensing layer 124 covers the other portion of the sidewall 152 of the insulation layer 150. In the present embodiment, owing to the arrangement of the light shielding layer 330, the profile of the shielded portion 124A of the photo-sensing layer 124 is different from the profile of the photo-sensing layer 124. According to other embodiments, the light shielding layer 130, 230, or 330 can be cut to form a plurality of patterns, or the light shielding layer 130, 230, or 330 can be distributed on the substrate in another form, so as to shield at least 55% of the entire area of the photo-sensing layer 124. Hence, the distribution of the light shielding layer 130 and the shielded portion 124A provided in the aforesaid embodiments and the drawings is merely exemplary, and the shape of the profile of each component is not limited to what is depicted in the drawings.

To sum up, the photosensor provided in one or more embodiments of the disclosure includes the light shielding layer shielding the partial area of the photo-sensing layer, and the electrode layer exists between the light shielding layer and the photo-sensing layer. As such, even in the case of strong ambient light, the photo-sensing layer of the photosensor can have the desired sensing sensitivity and is not apt to be damaged. Besides, in the process of manufacturing the light shielding layer, the photo-sensing layer is not in contact with any etchant and can thus be protected from the resultant damages. Accordingly, the photosensor provided in one or more embodiments of the disclosure has the favorable sensing sensitivity and long service life and can be applied when the ambient light beams having different intensities are given.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A photosensor comprising:
   a substrate;
   a sensing device disposed on the substrate and comprising:
      a first electrode disposed on the substrate;
      a photo-sensing layer disposed on the first electrode;
      a second electrode layer disposed on the photo-sensing layer, the photo-sensing layer being interposed between the first electrode and the second electrode;
      an insulation layer disposed on the first electrode, wherein an opening is defined by sidewalls of the insulation layer, the opening exposes the first electrode, wherein the photo-sensing layer is in contact with the sidewalls of the insulation layer and a top surface of the insulation layer, wherein the second electrode is in contact with a top surface of the photo-sensing layer, sidewalls of the photo-sensing layer, and the top surface of the insulation layer; and
   a light shielding layer contacting the second electrode and providing protection from irradiation of light beams, wherein the photo-sensing layer has a shielded portion shielded by the light shielding layer and a photo-receiving portion not shielded by the light shielding layer, and an area of the shielded portion is 55% to 99% of an entire area of the photo-sensing layer.

2. The photosensor according to claim 1, wherein at least one portion of the shielded portion of the photo-sensing layer covers the sidewalls.

3. The photosensor according to claim 1, wherein at least one portion of the shielded portion of the photo-sensing layer is arranged along the sidewalls.

4. The photosensor according to claim 1, wherein at least one portion of the shielded portion of the photo-sensing layer covers one portion of the sidewalls, and at least one portion of the photo-receiving portion of the photo-sensing layer covers the other portion of the sidewalls.

5. The photosensor according to claim 1, wherein the light shielding layer is shaped as a ring, so that the shielded portion of the photo-sensing layer surrounds the photo-receiving portion.

6. The photosensor according to claim 1, wherein the light shielding layer is arranged to allow the photo-receiving portion of the photo-sensing layer to surround the shielded portion.

7. The photosensor according to claim 1, wherein a distance from a junction between the shielded portion and the photo-receiving portion of the photo-sensing layer to an edge of the photo-sensing layer is a fixed distance.

8. The photosensor according to claim 1, wherein a profile defined by a junction between the shielded portion and the photo-receiving portion of the photo-sensing layer and a profile of the photo-sensing layer have an identical geometric shape.

9. The photosensor according to claim 1, wherein a material of the light shielding layer comprises metal, metal nitride, a photoresist material, ink, or a combination thereof.

10. The photosensor according to claim 1, wherein an area of an orthogonal projection of the light shielding layer on the substrate and an area of an orthogonal projection of the shielded portion of the photo-sensing layer on the substrate are overlapped.

11. The photosensor according to claim 1, wherein an area of an orthogonal projection of the light shielding layer on the substrate and an area of an orthogonal projection of the photo-receiving portion of the photo-sensing layer on the substrate are not overlapped.

12. The photosensor according to claim 1, wherein a material of the photo-sensing layer comprises silicon-rich oxide, silicon-rich nitride, silicon-rich oxynitride, silicon-rich carbide, silicon-rich carbon oxide, hydrogenated silicon-rich oxide, hydrogenated silicon-rich nitride, hydrogenated silicon-rich carbide, or a combination thereof.

13. The photosensor according to claim 1, further comprising an active device disposed on the substrate, wherein the first electrode is electrically connected to the active device.

14. The photosensor according to claim 13, wherein the light shielding layer comprises a first light shielding portion and a second light shielding portion, the first light shielding portion shields the area of the shielded portion of the photo-sensing layer, and the second light shielding portion shields an area of the active device.

15. The photosensor according to claim 14, wherein the second electrode extends toward the active device and is further disposed above the active device, and the first light shielding portion and the second light shielding portion are both disposed on the second electrode.

16. The photosensor according to claim 13, wherein the active device is a thin film transistor, and the first electrode is electrically connected to a drain of the thin film transistor.

17. The photosensor according to claim 16, wherein the first electrode and the drain of the thin film transistor are integrally formed.

* * * * *